(12) United States Patent
Manepalli et al.

(10) Patent No.: US 7,718,904 B2
(45) Date of Patent: May 18, 2010

(54) ENHANCING SHOCK RESISTANCE IN SEMICONDUCTOR PACKAGES

(75) Inventors: Rahul N. Manepalli, Chandler, AZ (US); Sairam Agraharam, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 519 days.

(21) Appl. No.: 11/273,879

(22) Filed: Nov. 15, 2005

(65) Prior Publication Data

US 2007/0111375 A1     May 17, 2007

(51) Int. Cl.
*H01R 12/04*    (2006.01)
*H05K 1/00*     (2006.01)

(52) U.S. Cl. ..................... 174/262; 174/260
(58) Field of Classification Search .......... 174/260, 174/262
See application file for complete search history.

(56) References Cited

U.S. PATENT DOCUMENTS

| | | | |
|---|---|---|---|
| 5,983,492 A | 11/1999 | Fjelstad | |
| 6,177,728 B1 * | 1/2001 | Susko et al. | 257/737 |
| 6,181,219 B1 * | 1/2001 | Gailus et al. | 333/33 |
| 6,316,288 B1 | 11/2001 | Hashimoto | |
| 6,329,610 B1 * | 12/2001 | Takubo et al. | 174/264 |
| 6,348,741 B1 | 2/2002 | Ogino et al. | |
| 6,399,896 B1 * | 6/2002 | Downes et al. | 174/260 |
| 6,407,927 B1 * | 6/2002 | Fasano | 361/760 |
| 6,573,459 B2 * | 6/2003 | Baker et al. | 174/260 |
| 6,914,333 B2 * | 7/2005 | Lo et al. | 257/737 |
| 7,301,108 B2 * | 11/2007 | Egitto et al. | 174/262 |
| 2002/0025655 A1 | 2/2002 | Satoh et al. | |
| 2002/0034872 A1 | 3/2002 | Kazama et al. | |

* cited by examiner

*Primary Examiner*—Ishwarbhai B Patel
(74) *Attorney, Agent, or Firm*—Trop, Pruner & Hu, P.C.

(57) ABSTRACT

A shock load applied to a solder ball may be cushioned by providing a viscoelastic material in association with the solder ball. The viscoelastic material dampens shock loads applied to the solder ball and reduces the rate of failure between the solder ball and the rest of the package.

9 Claims, 4 Drawing Sheets

ENHANCING SHOCK RESISTANCE IN SEMICONDUCTOR PACKAGES

BACKGROUND

This invention relates generally to semiconductor packaging.

Semiconductor packages typically are connected to a motherboard via the use of solder balls. Such packages should survive shock and vibration as may occur during shipping, for example.

The solder balls are typically soldered to the package leads by formation of intermetallic compounds (IMC's). These IMC's are typically very brittle and can undergo fracture easily under shock and vibration conditions. This is especially true in the case of lead free solders and lead free packaging technologies since both the lead free solders and the IMC's formed by the lead free solders are typically stiffer and more brittle than current leaded solders.

Further, with the need to miniaturize devices and increase packing density, the size and pitch of the solder balls is continuing to decrease. Smaller solder balls lead to a higher risk for shock and vibration related failures in the solder joint.

DETAILED DESCRIPTION

Figure 1:
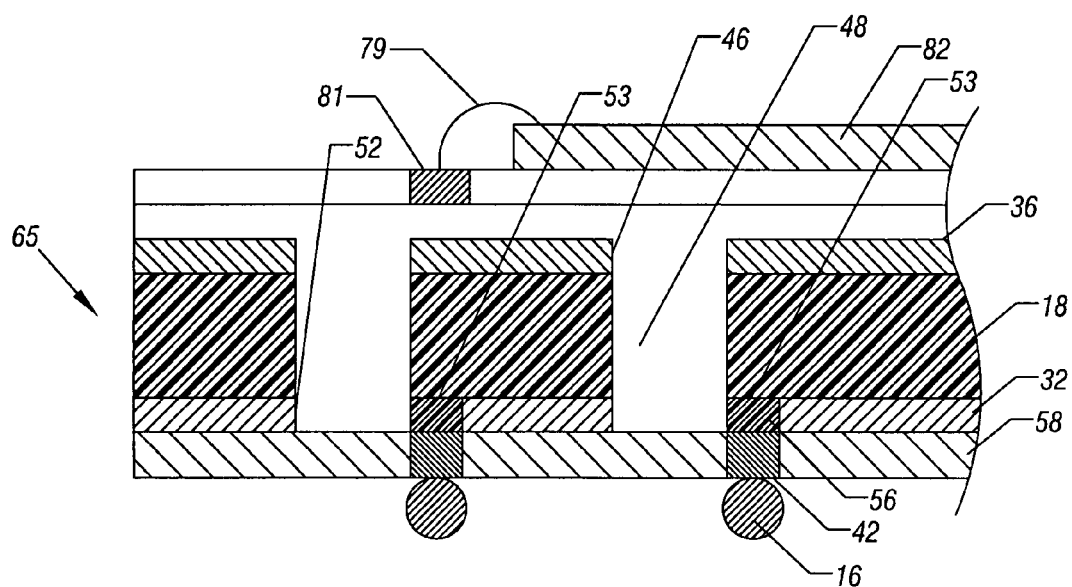
FIG. 1 is an enlarged, partial, cross-sectional view of a package in accordance with one embodiment of the present invention.

Referring to FIG. 1, a semiconductor package 65 may, in one embodiment, be a chip scale package (CSP). A chip scale package is a single die, direct surface mountable package of no more than 1.2 times the original die area. A chip scale package may be a flip chip, non-flip chip, wire bonded, ball grid array or leaded package, to give a few examples.

The package 65 may include a core 18 having vias 48 extending therethrough. The vias 48 may be lined, unlined, unplugged, or plugged. In one embodiment, the core 18 may be a drilled core with drilled vias 48. The package 65 may also be any package type including packages with electrical terminals other than solder balls. Other terminals may be metallic terminals including pins, plugs, and sockets, to mention a few examples.

Mounted over the core 18 may be an integrated circuit 82, such as a processor. The circuit 82 may be coupled electrically through the package 65 to terminals on the opposite side of the package. In one embodiment, those terminals may be solder balls 16. In one embodiment, the circuit 82 may be electrically coupled to the package 65 through wire bonds 79 and bond pads 81.

Sandwiching the core 18 are metallizations 36 and 32 in a CSP embodiment. In one embodiment, the metallizations 32 and 36 may be formed of copper. The metallization 36 has openings 46 which, in one embodiment, are aligned with the vias 48. The metallization 32 has openings 52 which may be at least partially unaligned with the vias 48 in one embodiment. In one embodiment, the openings 52 are larger than the vias 48 so that they overlap at extension 53 under a portion of the core 18 on at least one side.

The vias 48 may be filled with a metal liner or plug (not shown) in some embodiments. However, in some embodiments, no liner or plug may be used. Also formed in the extensions 53 may be a viscoelastic material 56. The viscoelastic material 56 may have a low Young's modulus for purposes explained hereinafter.

Under the metallization layer 32 may be a solder resist 58. The solder resist 58 may have an opening formed therein which is filled with a contact 42. The contact 42 may make electrical connection to the via 48 liner, if any, or to a metallization not visible in FIG. 1.

Solder balls 16 may be surface mounted to the contacts 42. Thus, electrical connections may be made through the core 18 to the solder balls 16.

Any shock loading of the package 65 may be cushioned by the viscoelastic material 56. Particularly, any shock on the solder ball 16, particularly in an upward direction, drives the contact 42 into the viscoelastic material 56 which dampens the shock loading. In effect, then, the viscoelastic material 56 acts as a spring which cushions any excessive shock loading on the solder ball 16.

Figure 2:
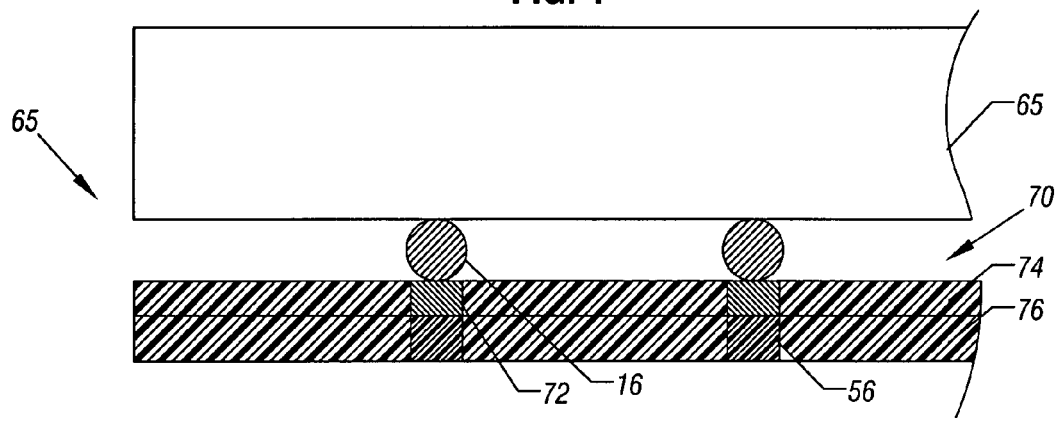
FIG. 2 is an enlarged, partial, cross-sectional view of the package in place on a printed circuit board in accordance with one embodiment of the present invention.

Referring next to FIG. 2, the package 65 may be mounted on a circuit board 70 such as a printed circuit board. In one embodiment, the circuit board 70 may have a lower layer 76 and an upper layer 74, punctuated by embedded contacts 72. The solder balls 16 may be surface mounted onto the contacts 72. Thus, any shock loading applied through the circuit board 70 to the solder ball 16 may be cushioned by the viscoelastic material 56 in both the package 65 and, in some embodiments, within the circuit board 70.

Figure 3:
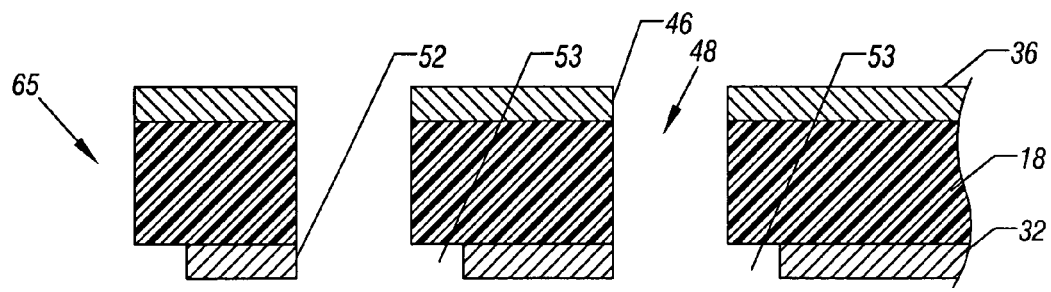
FIG. 3 is an enlarged, partial, cross-sectional view corresponding to FIG. 1 at an early stage of manufacture.
Figure 4:
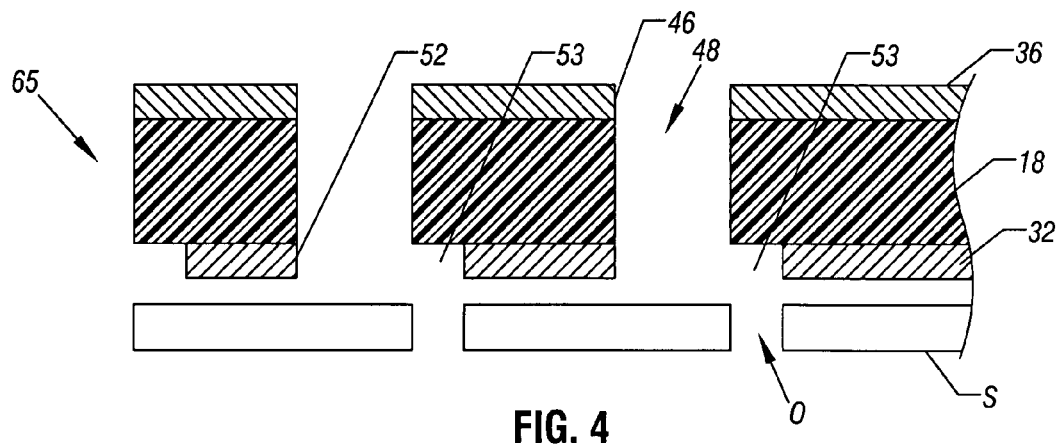
FIG. 4 is an enlarged, partial, cross-sectional view corresponding to FIG. 3 at a subsequent stage of manufacture in accordance with one embodiment of the present invention.

The method of manufacturing the structure 65, shown in FIG. 1, in accordance with one embodiment of the present invention, is shown in FIGS. 3-8. Initially, the core 18 has already been drilled to form vias 48 as indicated in FIG. 3. Moreover, the core 18 has been coated with the upper metallization 36 and lower metallization 32. As already noted, the openings 46 and 52 may allow electrical communication through the core 18 via the vias 48 in some cases. Thus, in one embodiment, copper metallizations 32, 36 may be formed on either side of the via 48. An extension 53 of opening 52 extends under the core 18 on one side as shown in FIG. 4.

Figure 5:
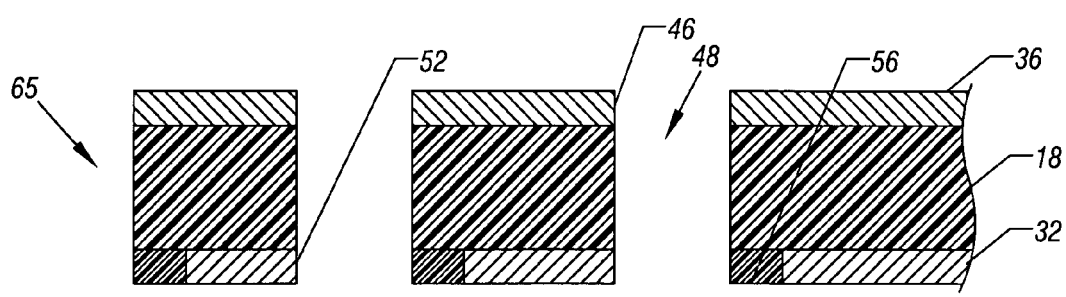
FIG. 5 is an enlarged, partial, cross-sectional view corresponding to FIG. 4 at a subsequent stage of manufacture in accordance with one embodiment of the present invention.

The extension 53 is filled by stencil printing a compliant layer using a stencil S with openings O aligned with the extensions 53, as indicated in FIG. 4. Then, as shown in FIG. 5, a viscoelastic material 56 may be printed into the extensions 53 through the stencil S openings O.

Figure 6:
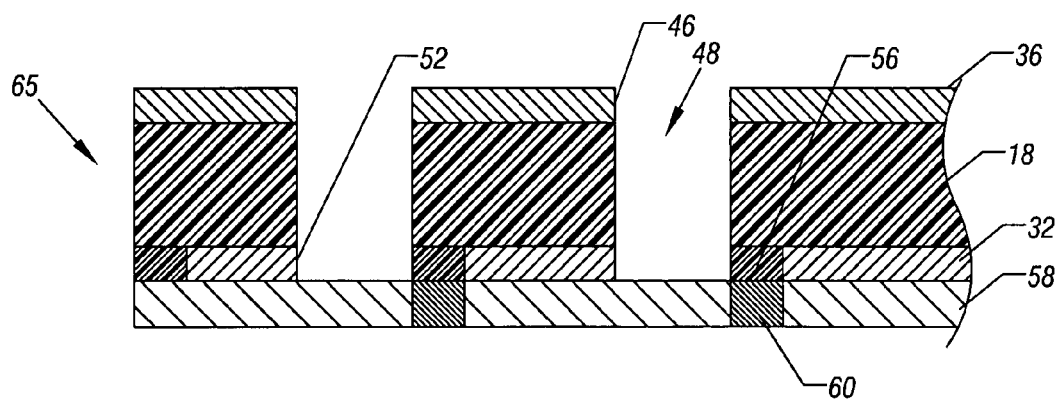
FIG. 6 is an enlarged, partial, cross-sectional view at a stage subsequent to that shown in FIG. 5 in accordance with one embodiment of the present invention.
Figure 7:
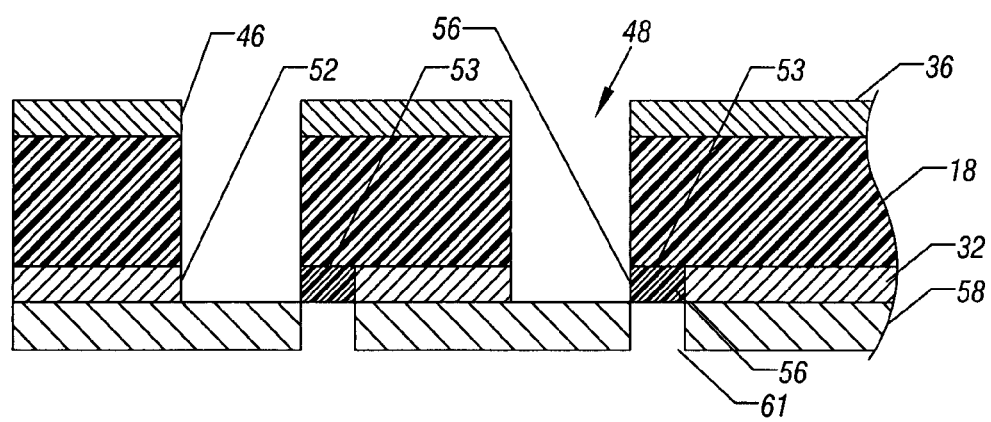
FIG. 7 is an enlarged, partial, cross-sectional view at a subsequent stage in accordance with one embodiment of the present invention.
Figure 8:
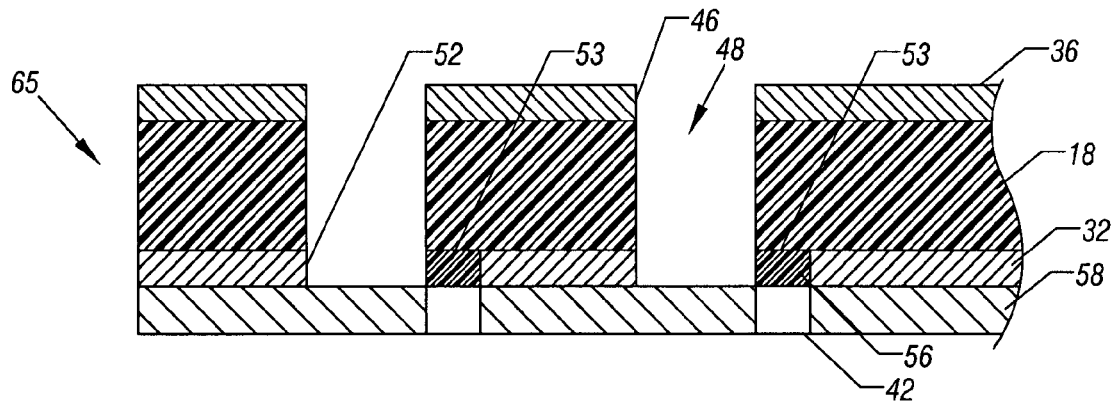
FIG. 8 is an enlarged, partial, cross-sectional view at a subsequent stage in accordance with one embodiment of the present invention.

Next, as shown in FIG. 6, a solder resist 58 may be applied. The solder resist 58 may be exposed and developed to form exposed regions 60. The regions 60 may then be removed to form openings 61 (FIG. 7) and filled with a metal to form contacts 42 as shown in FIG. 8. In other words, the openings 61 are filled with the metal contacts 42, shown in FIG. 8. In one embodiment, the metal for the contacts 42 may be a nickel, gold alloy. The contacts 42 make electrical connections to a metallizations (not shown). Thereafter, the solder balls 16 may be surface mounted onto the contacts 42. The resulting structure is shown in FIG. 1.

Fine pitched ball grid array packages with lead-free solder balls that exhibit a high rate of failure in drop and shock tests may be cushioned by the viscoelastic material 56. The primary mode for such failures may be the brittle intermetallics between the solder balls and the surface finish of a substrate or motherboard. With decreasing pitch and increasing number of balls in chip scale packages, this failure mode would get worse without remediation, resulting in interconnection open and catastrophic failure of components.

With the viscoelastic material 56, shock loading may be easily dissipated by the compliant layer, thereby reducing energy transfer to the sphere/interface. In some embodiments, a similar compliant layer may be applied on the motherboard side, as indicated in FIG. 2, thereby allowing further shock dampening. In other words, viscoelastic material 56 may be used in association with the circuit board 70 as well.

The choice of the compliant layer for the material 56 is important to affect a shock energy dampening and energy transfer reduction. In addition, the material chosen may be compatible with substrate manufacturing processes. One characteristic of the material may be to have high loss tangent or high loss modulus as frequencies corresponding to shock loads. Typical materials that may be used for this application include silicones with molecular weights tuned so that the loss tangent is high at the shock frequencies, silicone modified epoxy, or polyimide resins and low molecular weight rubbers such as carboxy-terminated butadiene-acrylonitrile (CTBN). In general, it is advantageous that the viscoelastic material 56 have a Young's modulus of less than about 3 gigaPascals at room temperature.

Figure 9:
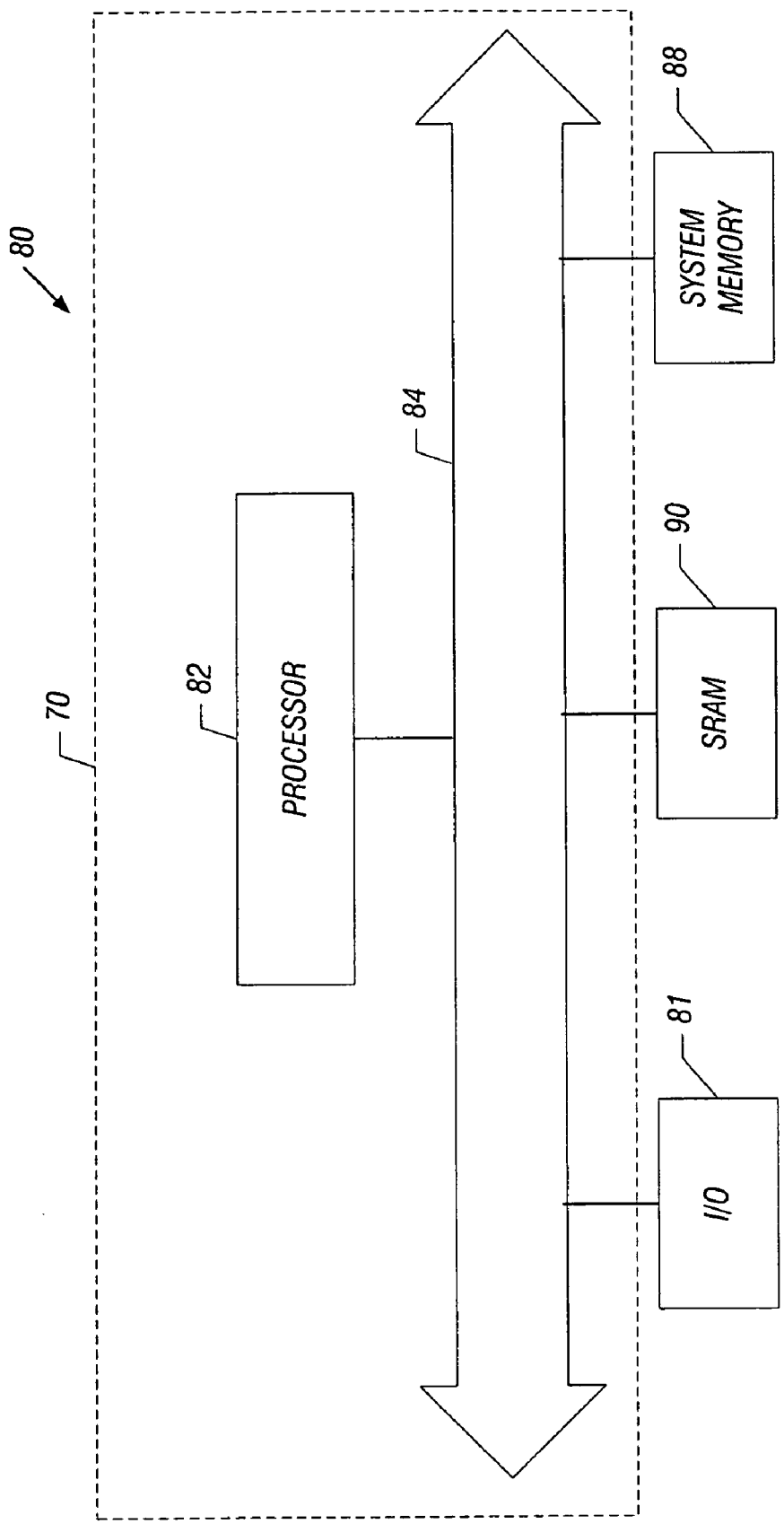
FIG. 9 is a system depiction for one embodiment.

Referring to FIG. 9, a processor-based system 80, in accordance with one embodiment of the present invention, is depicted. The system may be a processor-based system in one embodiment. Thus, the system 80 may be a computer, a laptop computer, a desktop computer, a server, a media player, a portable device, or a digital camera, to mention a few examples.

In some embodiments, the system 80 may include a processor 82. The processor 82, in one embodiment, may be implemented by the package 65. The processor 102 may be coupled to a motherboard that acts as a circuit board 70. The circuit board 70 may include the processor 82, together with a bus 84.

Additional integrated circuits may be coupled to the circuit board 70. Examples of common components in processor-based systems include an input/output (I/O) interface 81, a static random access memory (SRAM) 90, and a system memory 88, which, in some embodiments, may be implemented by dynamic random access memory (DRAM). Of course, the architecture of the system 80 is subject to considerable variability and a wide variety of other components may be included as well.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor package comprising:
    a structure having a core with metal layers on either side of said core, wherein said core includes apertures and said metal layers include apertures, the apertures in one of said metal layers extending beyond the apertures in said core to form an extension;
    a terminal coupled to said structure; and
    an elastic material between said structure and said terminal, said material contacting said terminal.

2. The package of claim 1 wherein said package is a chip scale package.

3. The package of claim 1 wherein said elastic material has a Young's modulus of less than 3 gigaPascals at room temperature.

4. The package of claim 1 further attached to a circuit board.

5. The package of claim 4 wherein said circuit board includes an elastic material and said terminal and said package are secured electrically to said circuit board.

6. The package of claim 1 wherein said elastic material is in said extension.

7. A semiconductor package comprising:
    a core with metal layers on either side of said core;
    a terminal coupled to said core;
    an elastic material between said core and said terminal; and
    wherein said core includes apertures and said metal layers include apertures, the apertures in one of said metal layers extending beyond the apertures in said core to form an extended aperture.

8. The package of claim 7 wherein said elastic material is in said extended aperture.

9. The package of claim 8 including a conductor between said elastic material and said terminal.

* * * * *